United States Patent
Ferreira et al.

(10) Patent No.: US 11,997,453 B2
(45) Date of Patent: May 28, 2024

(54) ELECTRONIC EQUIPMENT INCLUDING A SOUND-PROOF ACOUSTIC DUCT

(71) Applicant: SAGEMCOM BROADBAND SAS, Rueil Malmaison (FR)

(72) Inventors: Arnaud Ferreira, Rueil Malmaison (FR); Charles-Efflam Martin De Montaudry, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 51 days.

(21) Appl. No.: 17/673,065

(22) Filed: Feb. 16, 2022

(65) Prior Publication Data
US 2022/0272441 A1 Aug. 25, 2022

(30) Foreign Application Priority Data
Feb. 22, 2021 (FR) ...................... 2101685

(51) Int. Cl.
*H04R 1/34* (2006.01)
*G06F 1/20* (2006.01)
*H04R 1/28* (2006.01)
*H05K 1/02* (2006.01)
*H05K 7/20* (2006.01)

(52) U.S. Cl.
CPC ........... *H04R 1/342* (2013.01); *H04R 1/2853* (2013.01); *H04R 1/2869* (2013.01); *G06F 1/203* (2013.01); *H04R 2499/11* (2013.01); *H05K 1/0212* (2013.01); *H05K 7/2039* (2013.01)

(58) Field of Classification Search
CPC .... G06F 1/203; H05K 7/2039; H05K 1/0212; H04R 1/342; H04R 1/2853; H04R 1/2869; H04R 2499/11
See application file for complete search history.

(56) References Cited

U.S. PATENT DOCUMENTS

| | | | |
|---|---|---|---|
| 2007/0238495 A1* | 10/2007 | Hawker | H04R 1/2846 455/575.5 |
| 2012/0046780 A1* | 2/2012 | Rothkopf | H04R 1/02 381/361 |
| 2014/0072141 A1* | 3/2014 | Cohen | H04R 1/04 381/91 |

(Continued)

FOREIGN PATENT DOCUMENTS

| | | |
|---|---|---|
| WO | WO2020/032515 A1 | 2/2020 |
| WO | WO2020/143315 A1 | 7/2020 |

*Primary Examiner* — Carolyn R Edwards
*Assistant Examiner* — Kuassi A Ganmavo
(74) *Attorney, Agent, or Firm* — Muncy, Geissler, Olds & Lowe, P.C.

(57) ABSTRACT

Electronic equipment includes a cover including a first hole, a printed circuit having at least one microphone mounted thereon and including a second hole, a heatsink including a third hole, a thermal pad including a fourth hole, and a compression element, the electronic equipment being arranged in such a manner that the first hole, the second hole, the third hole, and the fourth hole together define an acoustic duct that is arranged to enable the microphone to pick up sound signals coming from outside the electronic equipment, and in such a manner that the compression element compresses the thermal pad around the acoustic duct in order to ensure sound-proofing of the acoustic duct.

10 Claims, 3 Drawing Sheets

(56) References Cited

U.S. PATENT DOCUMENTS

| | | | |
|---|---|---|---|
| 2014/0196878 A1* | 7/2014 | Holman, IV | H05K 3/0061 |
| | | | 165/185 |
| 2018/0027694 A1* | 1/2018 | Uchino | G06F 1/203 |
| | | | 361/722 |
| 2018/0084339 A1* | 3/2018 | Asuncion | H04N 23/51 |
| 2019/0027808 A1* | 1/2019 | Mow | H04R 5/04 |
| 2019/0208675 A1* | 7/2019 | Sabatier | H05K 9/0032 |
| 2019/0223319 A1* | 7/2019 | Engelhardt | H05K 7/20336 |
| 2020/0228888 A1* | 7/2020 | Sun | H04R 5/027 |
| 2021/0321185 A1* | 10/2021 | Kim | H04R 1/406 |

\* cited by examiner

ELECTRONIC EQUIPMENT INCLUDING A SOUND-PROOF ACOUSTIC DUCT

The invention relates to the field of electronic equipment including one or more microphones.

BACKGROUND OF THE INVENTION

On the market, there exist numerous kinds of electronic equipment fitted with microphones.

Such electronic equipment includes equipment incorporating a personal voice assistant (Google, Alexa, Siri, etc.). In all such electronic equipment, voice recognition operates on the basis of one or more microphones suitably arranged relative to one another in order to obtain the best audio response.

Each microphone needs to be acoustically isolated from the others. This means that the acoustic duct between the ambient medium and the diaphragm of the microphone component needs to be completely sound-proof.

This sound-proofing is essential for the processing of the audio signal that serves to achieve high-quality voice recognition. Specifically, it is important to ensure that a microphone does not pick up any portion of the sound signal that enters into the electronic equipment via the acoustic duct of another microphone. It is also important to ensure that the pickup of a microphone is not disturbed by internal noise from the electronic equipment.

In order to provide such sound-proofing, there is a first solution known in the prior art in which the printed circuit on which the microphone is mounted is attached to the plastics cover of the electronic equipment by means of screws. A tube of foam is put into place around the microphone. The torque with which the screws are tightened serves to compress the tube of foam, thereby sound-proofing it. That architecture goes against problems associated with reducing the size of electronic equipment, since it requires elements that are relatively voluminous: screw shanks, bulky screw heads, thick printed circuits, etc.

With reference to FIG. 1, a second solution is also known in the prior art.

The prior art electronic equipment includes a housing having a plastics internal chassis 2 arranged therein. A plastics cover 3 (e.g. made of acrylonitrile butadiene styrene (ABS)) serves to close the housing.

The electronic equipment 1 includes two electronic circuit cards: a motherboard 4 and a daughterboard 5.

The motherboard. 4 comprises a printed circuit having a processor 7 mounted thereon. The daughterboard 5 comprises a printed circuit having a microphone 8 mounted thereon.

The electronic equipment 1 also comprises a copper heatsink 9 and a thermal interface 10.

When the electronic equipment 1 is assembled, the heatsink 9 is fastened to the cover 3 by a layer 11 of thermal adhesive. The daughterboard 5 is fastened to the heatsink 9 by a layer 12 of thermal adhesive.

The thermal interface 10 is in contact both with the processor 7 of the motherboard 4 and also with the heatsink 9. The transfer of heat from the processor 7 to the outside thus takes place via the thermal interface 10, the heatsink 9, the thermal adhesive layer 11, and the cover 3.

It can also be seen that each of the cover 3, the heatsink 9, and the daughterboard 5 includes a respective hole. The holes are arranged on a common axis to form an acoustic duct 14. The microphone 8 is mounted on the inside face of the printed circuit of the daughterboard 5 (where the term "inside" is used herein to mean beside the inside of the electronic equipment once it is assembled, with the term "outside" being used herein to mean beside the outside of the electronic equipment).

In this example, the microphone 8 is an omnidirectional microphone of micro-electromechanical system (MEMS) type, which has in particular the advantage of being more compact than a microphone of the electret capacitor microphone (ECM) type. Furthermore, the microphone 8 is of the bottom port type, i.e. it includes a hole forming an inlet for sound signals that is placed under the housing of the microphone 8. Thus, sound signals coming from outside the electronic equipment 1 propagate along the acoustic duct 14 and pass through the printed circuit of the daughterboard 5 in order to reach the sensitive portion of the microphone 8.

The two thermal adhesive layers 11 and 12 serve to sound-proof the acoustic duct 14 at the interface between the cover 3 and the heatsink 9 and at the interface between the heatsink 9 and the daughterboard 5.

In terms of compactness, that solution is considerably better than the previously-described solution.

In that solution, it can be seen that the electronic equipment 1 comprises a first subassembly 15 and a second subassembly 16.

The first subassembly 15 comprises the cover 3, the motherboard 4, the heatsink 9 that is connected to the cover 3 via the thermal adhesive layer 11, and the daughterboard 5 that is connected to the heatsink 9 via the thermal adhesive layer 12.

The second subassembly 16 comprises only the chassis 2.

That solution presents the following problem.

The cover 3 constitutes the interface of the electronic equipment 1 with the outside, and as a result it may be subjected to knocks, scratching, various projections, etc. However, the cover plays an important part in the appearance of the electronic equipment 1, and it happens quite frequently that such electronic equipment is returned to the manufacturer's after-sales service in order to have the cover replaced. However, since the cover 3 is connected simultaneously to the heatsink 9, the motherboard 4, and to the daughterboard 5, replacing the cover 3 also involves replacing all of those elements. The operation of replacing the cover 3 is thus expensive. Furthermore, since the various components mentioned cannot be disassembled because of the thermal adhesive layers 11 and 12 between plastics materials and metals, those various components cannot be recycled. Once again, that raises a problem of cost, and also an ecological problem.

OBJECT OF THE INVENTION

In electronic equipment including a microphone, an object of the invention is to ensure sound-proofing of the acoustic duct connecting the microphone to the outside while also providing effective heat transfer, and to do so in a manner that is compact, inexpensive, and ecological.

SUMMARY OF THE INVENTION

In order to achieve this object, there is provided electronic equipment comprising a first subassembly and a second subassembly that are separable, the first subassembly comprising a cover including a first hole, the second subassembly comprising both a printed circuit having at least one microphone mounted thereon and including a second hole, and also a heatsink including a third hole, the electronic equipment further including a thermal pad including both a fourth hole and a compression element, the electronic equipment being arranged in such a manner that, once the electronic equipment is assembled, the heatsink is positioned between the cover and the printed circuit, the thermal pad is positioned between the cover and the heatsink, the first hole, the second hole, the third hole, and the fourth hole together define an acoustic duct that is arranged to enable the microphone to pick up sound signals coming from outside the electronic equipment, and the compression element compresses the thermal pad around the acoustic duct in order to ensure sound-proofing of the acoustic duct at an interface between the cover and the thermal pad and at an interface between the thermal pad and the heatsink.

The electronic equipment of the invention thus includes a thermal pad positioned between the cover and the heatsink. The thermal pad serves to transfer heat efficiently between the heatsink and the outside of the electronic equipment (via the cover). The compression element compressing the thermal pad around the acoustic duct serves to ensure that the acoustic duct is sound-proof.

There is thus no layer of adhesive between the cover and the heatsink, such that the first subassembly and the second subassembly can be disassembled from each other. It is thus possible to replace the cover without that replacement making it necessary to replace other components of the electronic equipment. The replacement is thus inexpensive, and the electronic equipment is easily recycled.

It should also be observed that assembling the electronic equipment of the invention does not require the printed circuit on which the microphone is mounted to be screwed to the cover, such that the electronic equipment is compact.

There is also provided electronic equipment as described above, wherein the compression element is a rib formed on the cover or on the heatsink.

There is also provided electronic equipment as described above, wherein the rib is formed on an inside face of the cover and extends around the first hole.

There is also provided electronic equipment as described above, wherein the rib is formed on an outside face of the heatsink and extends around the third hole.

There is also provided electronic equipment as described above, wherein the rib is annular in shape, and wherein the rib has both a width $\ell$ equal to the difference between an outside radius and an inside radius of the rib, and also a height h such that:

$$\ell \geq 3 \times h.$$

There is also provided electronic equipment as described above, wherein the rib has a height h and the thermal pad has a thickness e such that:

$$h \geq 0.5 \times e.$$

There is also provided electronic equipment as described above, wherein this gives:

$$D < C < B < A,$$

where D is the mean diameter of the first hole, C is the mean diameter of the third hole, B is the mean diameter of the fourth hole, and A is the inside diameter of the rib.

There is also provided electronic equipment as described above, wherein the thermal pad comprises graphite.

There is also provided electronic equipment as described above, wherein the printed circuit is fastened to the heatsink by a layer of thermal adhesive.

There is also provided electronic equipment as described above, the electronic equipment being a home gateway or a decoder box.

The invention can be better understood in the light of the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 1:
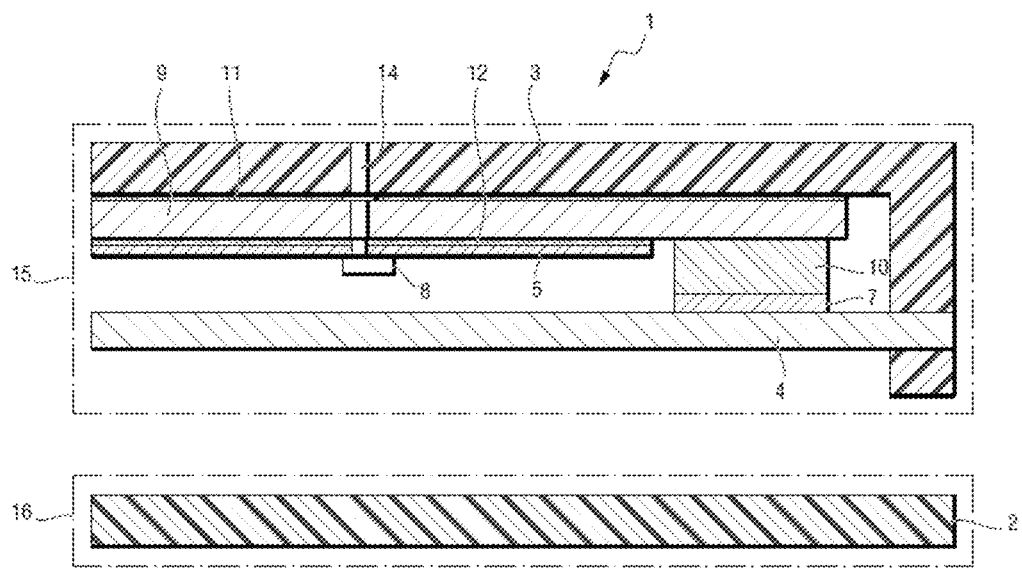
FIG. 1 shows prior art electronic equipment viewed in section on a plane perpendicular to a face of the cover.
Figure 2:
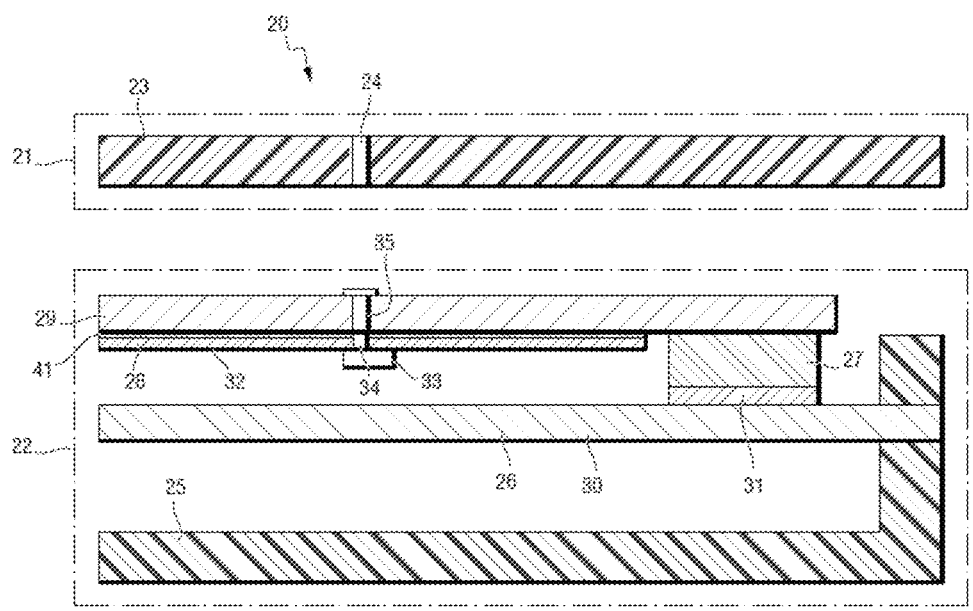
FIG. 2 shows electronic equipment of the invention in section view, the first and second subassemblies not being assembled together.

With reference to FIG. 2, in this example the electronic equipment 20 of the invention is a home gateway that incorporates a voice assistant.

The electronic equipment 20 comprises two separable subassemblies: a first subassembly 21 and a second subassembly 22.

The first subassembly 21 comprises a cover 23 made out of plastics material. The cover 23 includes a first hole 21.

The second subassembly 22 comprises a chassis 25, a motherboard. 26, a thermal interface 27, a daughterboard 28, and a heatsink 29.

The chassis 25 is made out of plastics material.

The motherboard 26 comprises a printed circuit 30 having a processor 31 mounted thereon.

The daughterboard 28 comprises a printed circuit 32 having a microphone 33 mounted thereon in this example, the daughterboard 28 is a flexible sheet, i.e. the printed circuit 32 is a flexible printed circuit. This technology enables the thickness of the printed circuit 32 to be small.

The microphone 33, which is mounted on the inside face of the printed circuit 32, is an omnidirectional microphone of MEMS type with a bottom port. The printed circuit 32 includes a second hole 34.

The heatsink 29 is a copper plate. The heatsink 29 includes a third hole 35.

Figure 3:
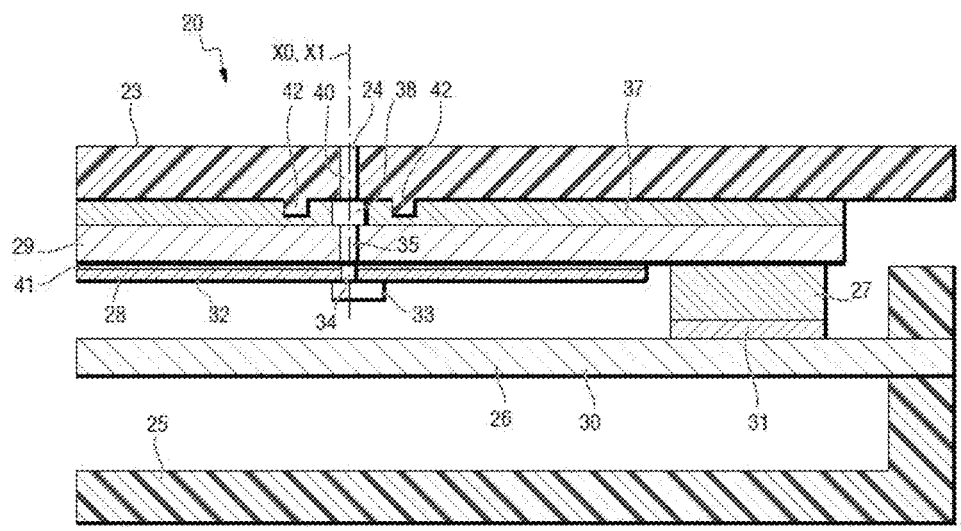
FIG. 3 is a view similar to FIG. 2, the first and second subassemblies being assembled together.
Figure 4:
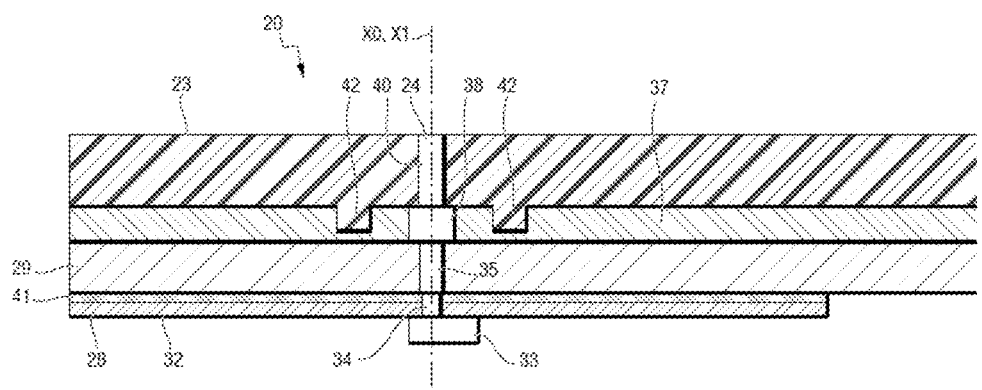
FIG. 4 is a detail view of FIG. 3.

With reference to FIGS. 3 and 4, the electronic equipment 20 also includes a pre-cut thermal pad 37.

The term "thermal pad" is used to designate a thermally conductive interface, e.g. in the form of a sheet or of a film.

The thermal pad 37 is compressible. By way of example, the thermal pad 37 comprises graphite.

The thermal pad 37 includes a fourth hole 38.

Once the electronic equipment 20 is assembled, the heatsink 29 is positioned between the cover 23 and the printed circuit 32 of the daughterboard 28, and the thermal pad 37 is positioned between the cover 23 and the heatsink 29.

The first hole 24, the second hole 34, the third hole 35, and the fourth hole 38 together define an acoustic duct 40 that is arranged to enable the microphone 33 to pick up sound signals coming from outside the electronic equipment 20. The first hole 24, the second hole 34, the third hole 35, and the fourth hole 38 are arranged on a common axis in the following order, going inwards from the outside: first hole 24, fourth hole 38, third hole 35, second hole 34. Thus, sound signals coming from the outside propagate along the acoustic duct. 40 and pass through the printed circuit 32 of the daughterboard 28 (via the second hole 34) in order to reach the sensitive portion of the microphone 33.

While the electronic equipment 20 is being assembled, the motherboard 26 is fastened to the chassis 25. The outside face of the daughterboard. 28 is adhesively bonded to the inside face of the heatsink 29 by a layer 41 of thermal adhesive.

The heatsink. 29 and the thermal interface 27 are arranged in such a manner that the thermal interface 27 is positioned between the printed circuit 30 of the motherboard 26 and the heatsink 29. The thermal interface 27 is in contact both with the processor 31 and with the heatsink 29.

The thermal pad 37 is placed on the heatsink 29.

The cover 23 is positioned on the heatsink 29.

There is no layer of adhesive between the cover 23 and the heatsink 29. The cover 23 and the heatsink 29 are not secured to each other and they are separable (the term "separable" being used to mean that the cover 23 and the heatsink. 29 can be separated easily, quickly, and without any risk of damaging either of them). Consequently, the first subassembly 21 and the second subassembly 22 are not secured to each other and they are separable.

The thermal pad 37 is compressed between the cover 23 and the heatsink 29.

In order to fill in the gap (initially full of air) that is present between the heatsink 29 and the cover 23, and in order to transfer heat to the ambient medium (i.e. to the outside), the thermal pad 37 closely matches the shape of the heatsink 29. The outline of the thermal pad 37 can be shifted by up to 0.5 millimeters (mm) towards the inside relative to the outline of the heatsink 29 in order to accommodate manufacturing tolerances and thus avoid the thermal pad 37 losing contact with the heatsink 29.

In order to guarantee that the thermal pad 37 is always compressed, thereby ensuring good heat transfer performance, the thermal pad 37 presents thickness that is greater than the maximum clearance between the cover 23 and the heatsink 29 once the electronic equipment 20 is assembled. By way of example, the thickness of the thermal pad 37 is equal to twice the thickness of the maximum gap for the worst-case manufacturing tolerances. In this example, for the electronic equipment 20, the worst-case tolerance stack-up may form a gap having a thickness of about 0.2 mm to 0.3 mm. In this example, the thermal pad 37 thus has a thickness equal to 0.5 mm.

The thermal pad 37 presents viscosity properties that enable the thermal pad 37 to cling both to the heatsink 29 and to the cover 23, while nevertheless allowing the cover 23 to be removed.

Heat is transferred between the processor 31 and the outside of the electronic 20 by conduction via the thermal interface 27, the heatsink 29, the thermal pad 37, and the cover 23. It should be observed that although the cover 23 is made out of plastics material, it nevertheless dumps heat effectively to the outside.

Attention is given below more particularly to the acoustic aspect.

As mentioned above, the thermal pad 37 is compressed between the cover 23 and the heatsink 29. Nevertheless, the area of the heatsink 29 is large, and merely compressing the thermal pad 37 between the inside face of the cover 23 and the outside face of the heatsink 29 is not sufficient for ensuring sound-proofing.

The following formula can be used to estimate the compression pressure:

$$P = \text{Force } (N)/\text{Area } (\text{mm}^2).$$

Thus, in accordance with that formula, in order to increase the compression it is appropriate to reduce the bearing surface area locally around the microphone 33 in order to increase the pressure that is exerted on the thermal pad 37.

The electronic equipment 20 thus includes a compression element that, once the electronic equipment 20 is assembled, compresses the thermal pad. 37 around the acoustic duct 40. The compression element serves to provide sound-proofing for the acoustic duct 40 at its fourth hole 38, i.e. both at the outside end of the fourth hole 38 (and thus at the interface between the cover 23 and the thermal pad 37), and also at the inside end of the fourth hole 38 (and thus at the interface between the thermal pad 37 and the heatsink 29).

In this example, the compression element is a rim 42 (which could also be called a "lip-seal") that is formed on the inside face of the cover 23 in this example, the rib 42 and the cover 23 thus form a single part. The rib 42 is thus formed when the cover 23 is made. The mold used for making the cabinet 23 includes a complementary groove for obtaining rim 42.

The rib 42, which is annular in shape about an axis X0, extends around the first hole 24 that is made in the cover 23. Once the electronic equipment 20 is assembled, the rib 42 and the first hole 24 are thus arranged on the same axis, i.e. the axis X0 and the axis X1 then coincide, where the axis X1 is the axis of the first hole 24 and also of the acoustic duct 40.

Thus, while the electronic equipment. 20 is being assembled, the thermal pad 37 is positioned on the heatsink 29, and then the cover 23 is placed on the thermal pad 37. The cover 23 compresses the thermal pad 37. The compression is greater against the rib 42, thereby serving to guarantee sound-proofing of the acoustic duct 40 where it passes through the thermal pad 37.

The dimensions of the rib 42 are selected so as to satisfy various constraints.

Figure 5:
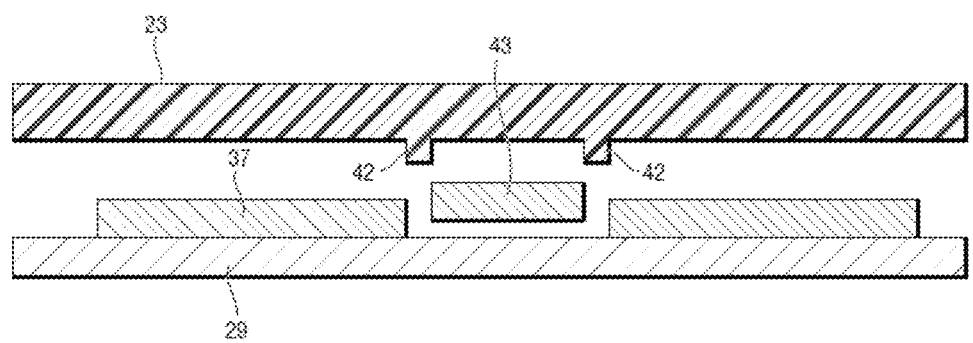
FIG. 5 shows a phenomenon of the thermal pad being punched.

Firstly, and with reference to FIG. 5, a rim 42 that projects too far can lead to a phenomenon of the thermal pad 37 being punched because its material is ultra-compressible. The thermal pad 37 may then nave a portion. 43 that is punched out partially or completely, thereby causing sound-proofing to be lost.

Figure 6:
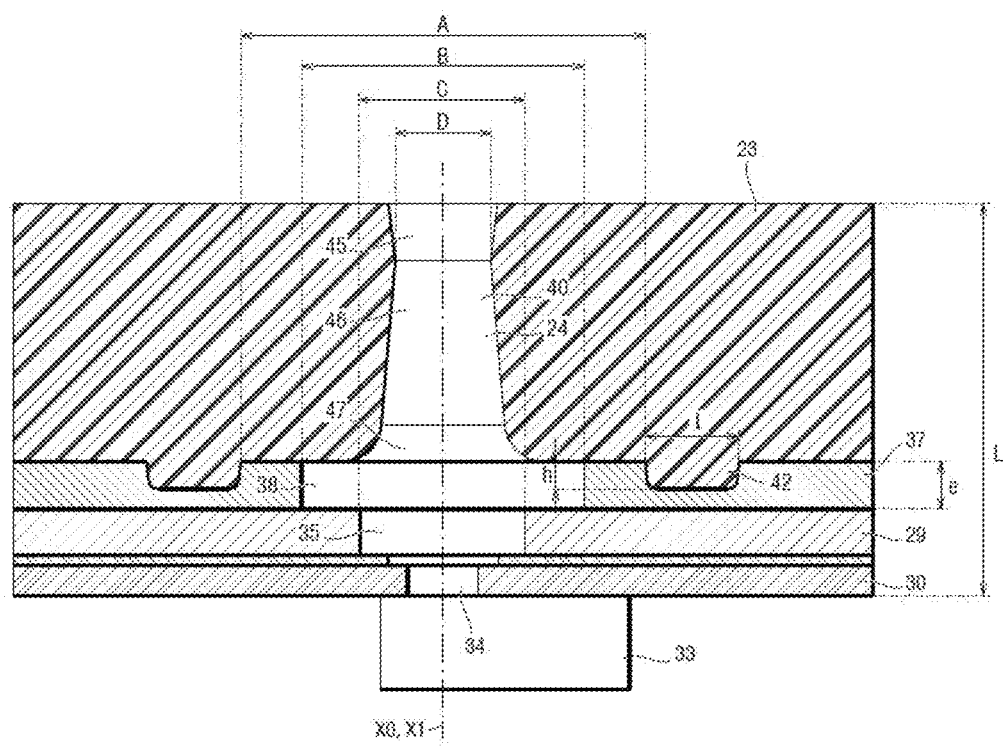
FIG. 6 shows the acoustic duct.

In order to counter this problem, and with reference to FIG. 6, the rib 42 is designed in such a manner as to have a width ℓ equal to the difference between an outside radius and an inside radius of the rib 42) and a height h that are such that:

$$\ell \geq 3 \times h.$$

Furthermore, in order to ensure sufficient compression locally and in order to avoid any leakage between the acoustic duct 40 and the ambient medium, provision is made for the height h to be such that:

$$h \geq 0.5 \times e,$$

where e is the thickness of the thermal pad 37.

The acoustic duct 40 is thus in the form of a tube that is closed at one end by the diaphragm of the microphone 33 and that is open to the outside of the electronic equipment 20 at its other end.

The acoustic duct 40 constitutes a medium promoting the formation of standing waves. The fundamental frequency of a tube, at which the first standing wave occurs, is inversely proportional to the length of the tube and to its diameter in application of the following relationship:

$$f_1 = \frac{v}{4 \times (L + 0.4 \times d)}$$

where L is the length of the acoustic duct, d is its diameter, and v is the speed of sound in the ambient medium.

This frequency can give rise to large disturbances in the sound signals received by the microphone 33, so it must lie outside the working frequency range, which for voice recognition means that it must be greater than 8 kHz. Thus, the diameter of the acoustic duct 40 and its length must be chosen accordingly.

Advantageously, the inlet diameter of the acoustic duct 40 is chosen to be equal to 1 mm, and the length L of the acoustic duct 40 is chosen not to exceed 10 mm. The inlet diameter of the acoustic duct 40 is the diameter of the outside end of the first hole 24.

Likewise, in order to guarantee continuity of the acoustic duct 40 and avoid potential positioning defects due to manufacturing and assembly tolerances, the holes in the various parts making up the acoustic duct 40 are formed with diameters such that D<C<B<A, where D is the mean diameter of the first hole 24 made in the cover 23 (i.e. the mean diameter of the inlet orifice of the acoustic duct 40), C is the mean diameter of the third hole 35 (i.e. of the hole through the heatsink 29), B is the mean diameter of the fourth hole 38 formed through the thermal pad 37, and A is the inside diameter of the annular rib 42. The term "mean diameter" of a hole is used to mean the average of the diameters of the hole along its length.

It should be observed that the first hole 24 has a conical inlet portion 45 (that opens out in the outside face of the cover 23), a conical central portion 46, and a flared portion 47 (which opens out in the inside face of the cover 23). The shape of the first hole 24 is due to the method of making the cover 23 (injection molding a plastics material).

The subassemblies of the electronic equipment 20 can thus be disassembled so as to guarantee good recycling of the various elements, and in particular the elements made of plastics materials (including the cover 23).

The electronic equipment 20 of the invention makes it possible, in reliable, inexpensive, and ecological manner, to satisfy the problems of after-sales service and of recycling, while ensuring excellent thermal and acoustic performance (and in particular at the interfaces between the mechanical parts involved in the solution). Naturally, the invention is not limited to the embodiment described, but covers any variant coming within the ambit of the invention as defined by the claims.

Above, the compression element is described as a rib formed on the inside face of the cover. That solution is not limiting in any way. By way of example, the compression element could be a rib formed on the outside face of the heatsink. The rib would then extend around the third hole formed in the heatsink. The compression element could also be a part that is separate from the cover and from the heatsink, e.g. a ring positioned between the thermal pad and the cover while assembling the electronic equipment.

Above, mention is made of only one microphone, however the electronic equipment could naturally have a plurality of microphones and thus a plurality of acoustic ducts arranged like the duct described above.

Naturally, the electronic equipment need not necessarily be a home gateway, and it could be any electronic equipment that includes a microphone: a smart speaker, a voice assistant, a decoder box, a tablet, a smartphone, etc.

The invention claimed is:

1. Electronic equipment comprising a first subassembly and a second subassembly that are separable, the first subassembly comprising a cover including a first hole, the second subassembly comprising both a printed circuit having at least one microphone mounted thereon and including a second hole, and also a heatsink including a third hole, the electronic equipment further comprising a compressible thermal pad including a fourth hole, and a compression element, the electronic equipment being arranged in such a manner that, once the electronic equipment is assembled, the heatsink is positioned between the cover and the printed circuit, the compressible thermal pad is positioned between the cover and the heatsink, the first hole, the second hole, the third hole, and the fourth hole together define an acoustic duct that is arranged to enable the microphone to pick up sound signals coming from outside the electronic equipment, and the compression element compresses the compressible thermal pad around the acoustic duct so that the compression of the compressible thermal pad between the cover and the heatsink is greater against the compression element, in order to ensure sound-proofing of the acoustic duct at an interface between the cover and the compressible thermal pad and at an interface between the compressible thermal pad and the heatsink.

2. The electronic equipment according to claim 1, wherein the compression element is a rib formed on the cover or on the heatsink.

3. The electronic equipment according to claim 2, wherein the rib is formed on an inside face of the cover and extends around the first hole.

4. The electronic equipment according to claim 2, wherein the rib is formed on an outside face of the heatsink and extends around the third hole.

5. The electronic equipment according to claim 2, wherein the rib is annular in shape, and wherein the rib has both a width l equal to the difference between an outside radius and an inside radius of the rib, and also a height h such that:

$$\ell \geq 3 \times h.$$

6. The electronic equipment according to claim 2, wherein the rib has a height h and the compressible thermal pad has a thickness e such that:

$$h \geq 0.5 \times e,$$

7. The electronic equipment according to claim 2, wherein the following applies:

$$D < C < B < A,$$

where D is the mean diameter of the first hole, C is the mean diameter of the third hole, B is the mean diameter of the fourth hole, and A is the inside diameter of the rib.

8. The electronic equipment according to claim 1, wherein the compressible thermal pad comprises graphite.

9. The electronic equipment according to claim 1, wherein the printed circuit is fastened to the heatsink by a layer of thermal adhesive.

10. The electronic equipment according to claim 1, the electronic equipment being a home gateway or a decoder box.

* * * * *